(12) United States Patent
Cannon et al.

(10) Patent No.: US 9,165,917 B2
(45) Date of Patent: Oct. 20, 2015

(54) IN-LINE STACKING OF TRANSISTORS FOR SOFT ERROR RATE HARDENING

(75) Inventors: Ethan H. Cannon, Essex Junction, VT (US); David F. Heidel, Mahopac, NY (US); K. Paul Muller, Wappingers Falls, NY (US); Alicia Wang, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 604 days.

(21) Appl. No.: 12/473,409

(22) Filed: May 28, 2009

(65) Prior Publication Data

US 2010/0301446 A1    Dec. 2, 2010

(51) Int. Cl.
*H01L 27/11* (2006.01)
*H01L 27/02* (2006.01)
*H01L 21/8238* (2006.01)
*H01L 27/092* (2006.01)

(52) U.S. Cl.
CPC .... *H01L 27/0207* (2013.01); *H01L 21/823871* (2013.01); *H01L 27/092* (2013.01)

(58) Field of Classification Search
CPC ... H01L 21/7624; H01L 27/105; H01L 27/02; H01L 29/4238; G11C 11/4125
USPC ........ 438/219, 295, 412, FOR. 187; 257/351, 257/E21.642, E21.632
See application file for complete search history.

(56) References Cited

U.S. PATENT DOCUMENTS

| | | | | |
|---|---|---|---|---|
| 4,639,622 A * | 1/1987 | Goodwin et al. | ............. | 327/589 |
| 4,849,804 A * | 7/1989 | Mader | ............. | 257/798 |
| 5,576,225 A * | 11/1996 | Zhang et al. | ................. | 438/158 |
| 5,972,742 A * | 10/1999 | Zhang et al. | ................. | 438/164 |
| 7,176,490 B2 * | 2/2007 | Isobe et al. | ....................... | 257/59 |
| 7,234,121 B2 | 6/2007 | Zhu et al. | | |
| 7,250,363 B2 | 7/2007 | Landis et al. | | |
| 7,278,076 B2 | 10/2007 | Zhang et al. | | |
| 7,381,635 B2 | 6/2008 | Cabral, Jr. et al. | | |
| 7,920,410 B1 * | 4/2011 | Lee et al. | ....................... | 365/154 |
| 2008/0001188 A1 * | 1/2008 | Cheng et al. | ................. | 257/288 |
| 2009/0253238 A1 * | 10/2009 | Shi et al. | ....................... | 438/279 |
| 2010/0084689 A1 * | 4/2010 | Nakamura | ..................... | 257/206 |
| 2010/0238714 A1 * | 9/2010 | Pedersen | ....................... | 365/156 |
| 2011/0053361 A1 * | 3/2011 | Muralidhar et al. | .......... | 438/585 |

* cited by examiner

*Primary Examiner* — George Fourson, III
(74) *Attorney, Agent, or Firm* — Cantor Colburn LLP

(57) ABSTRACT

Each one of a pair of CMOS transistors is formed in its own island and a gate terminal for each transistor is formed by a single, in-line conductor connecting both gate terminals together. This type of "in-line" connection achieves nearly a five-time improvement in the reduction of the ability of ionizing radiation particles to strike both transistors at the same time as compared to prior art "side-by-side" transistor stacking through use of a relatively smaller solid angle spanning the two transistors. This results in "hardening" of the transistors and improving their resistance to single event upsets and, thus, improving the soft error rate (SER) of the transistors.

11 Claims, 2 Drawing Sheets

IN-LINE STACKING OF TRANSISTORS FOR SOFT ERROR RATE HARDENING

The present invention relates to integrated circuits, and, more specifically, to reducing the soft error rate (SER) in integrated circuits.

As integrated circuit (IC) manufacturing technology continues to achieve ICs that are scaled downward in size, the probability of relatively highly energetic ionizing radiation particles reaching transistors formed as part of the IC increases. These particles may comprise cosmic neutrons or alpha particles emitted from solder bumps or C4s (controlled collapse chip connections) or from packaging materials such as ceramics. The energetic particle may have sufficient energy to penetrate into the active device silicon layer and generate or deposit a charge within the body or channel of a transistor device formed in a bulk or in a silicon-on-insulator (SOI) technology. This charge can turn a transistor "on" for a short period of time, where that transistor was previously turned "off." This momentarily disrupts proper operation of the transistor and the circuit (e.g., latch, SRAM/DRAM cells) that the transistor is a part of (i.e., the logic circuit latch or memory cell may undesirably change its stored binary state). This type of soft error event is typically referred to as a single event upset (SEU).

Various techniques are known to attempt to mitigate these soft errors. These include physically shielding the entire IC device from radiation through use of, e.g., a blocking layer as part of the IC. Also, logical techniques have been employed. For example, at a register level, parity bits are added to stored data and error correction codes are used to check for corrupted data. At the latch level, in which only a single bit of information is typically stored, three latches can be used to represent the same data and a two out of three majority circuit is used to read the data (i.e., ab+ac+bc). Redundant storage nodes may be employed and compared against one another. At the transistor level, pairs of redundant transistors for critical applications may be used, so that in case one of the two transistors is hit by ionizing radiation, the other still maintains the state of the circuit. These techniques, however, can be expensive to employ, in terms of area utilized on an IC, delay and/or power consumption. Or they may provide incomplete SER protection, e.g., when a multitude of transistors is hit by ionizing radiation simultaneously.

BRIEF SUMMARY

According to an embodiment of the invention, a method of forming a pair of transistors includes forming a first transistor in a first semiconductor island. The method also includes forming a second transistor in a second semiconductor island, wherein the second semiconductor island is separate from the first semiconductor island and wherein the first and second semiconductor islands are arranged in an in-line configuration that reduces the probability of an ionizing radiation particle striking the first and second transistors causing a single event upset to occur. The method further includes providing a single gate terminal conductor for both the first and second transistors.

According to another embodiment of the invention, an integrated circuit includes a first transistor located in a first semiconductor island. The integrated circuit also includes a second transistor located in a second semiconductor island, wherein the second semiconductor island is separate from the first semiconductor island and wherein the first and second semiconductor islands are arranged in an in-line configuration that reduces the probability of an ionizing radiation particle striking the first and second transistors causing a single event upset to occur. The integrated circuit further includes a single gate terminal conductor for both the first and second transistors.

This type of transistor "in-line" arrangement achieves nearly a five-time improvement in the reduction of the ability of ionizing radiation particles to strike both transistors at the same time as compared to prior art "side-by-side" transistor stacking through use of a relatively smaller solid angle spanning the two transistors. This results in "hardening" of the transistors and improving their resistance to single event upsets and, thus, improving the soft error rate (SER) of the transistors.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other features and advantages of the invention are apparent from the following detailed description in conjunction with the accompanying drawings in which:

DETAILED DESCRIPTION

Figure 1:
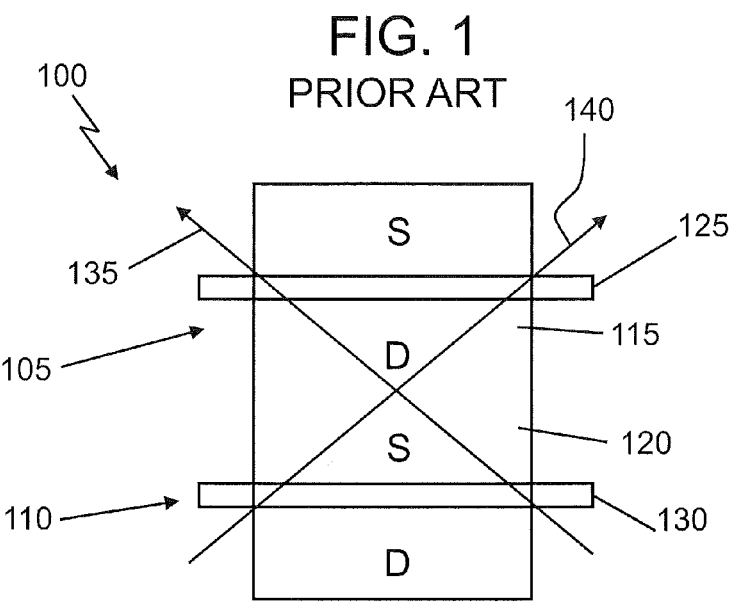
FIG. 1 illustrates two CMOS transistors arranged "side-to-side" such that the gate conductor of each transistor are arranged parallel to each other, as in the prior art.

Referring to FIG. 1, there illustrated is a prior art arrangement 100 of two complementary metal-oxide-semiconductor (CMOS) transistors 105, 110 formed, for example, using silicon-on-insulator (SOI) technology. These are critical transistors in a sense that they are part of a logic storage element, and if they are hit by ionizing radiation, the stored data can be altered (i.e., upset). For that reason they are formed as a pair of redundant transistors to ensure SER robustness. If one transistor of this pair is hit by ionizing radiation, the other still maintains the state of the circuit. The drain 115 of the upper transistor 105 in FIG. 1 is connected or contiguous with the source 120 of the lower transistor 110 in FIG. 1. It is common to form these two transistors 105, 110 in a single RX (semiconductor) island using SOI technology. Both gates are driven by the same node. This arrangement 100 is commonly referred to as "side-to-side" stacking of the two transistors 105, 110, where such stacking is relatively efficient in terms of area of the integrated circuit (IC) utilized (i.e., a relatively compact transistor layout) as well as the amount of interconnect wiring required. As seen in FIG. 1, the gate terminal conductors 125, 130 for each of the two transistors 105, 110 are parallel to each other.

However, a problem with this prior art "side-to-side" transistor stacking arrangement 100 is that, from an SER perspective, primary or secondary ionizing radiation particles traveling in the SOI plane have a relatively large solid angle where they can travel from the body of one CMOS transistor 105, 110 in FIG. 1 to the body of the other CMOS transistor 105, 110 and cause an upset. In other words, the ionizing particles have a relatively large solid angle for hitting both transistors 105, 110. This relatively large solid angle is represented as the angle between the two lines with arrowheads 135, 140 shown in FIG. 1. In a typical embodiment, this solid angle is dominated by the angle in the plane of the drawing, which spans approximately 115 degrees. Although some SER robustness is gained by forming these transistors as a pair of redundant transistors, ionizing radiation particles hitting both transistors 105, 110 still can cause a momentary increase in the current through the two transistors 105, 110, thereby causing the two transistors 105, 110 to undesirably change their binary logic states, resulting in an upset and an increase in the SER of the IC that embodies the two transistors 105, 110.

Figure 2:
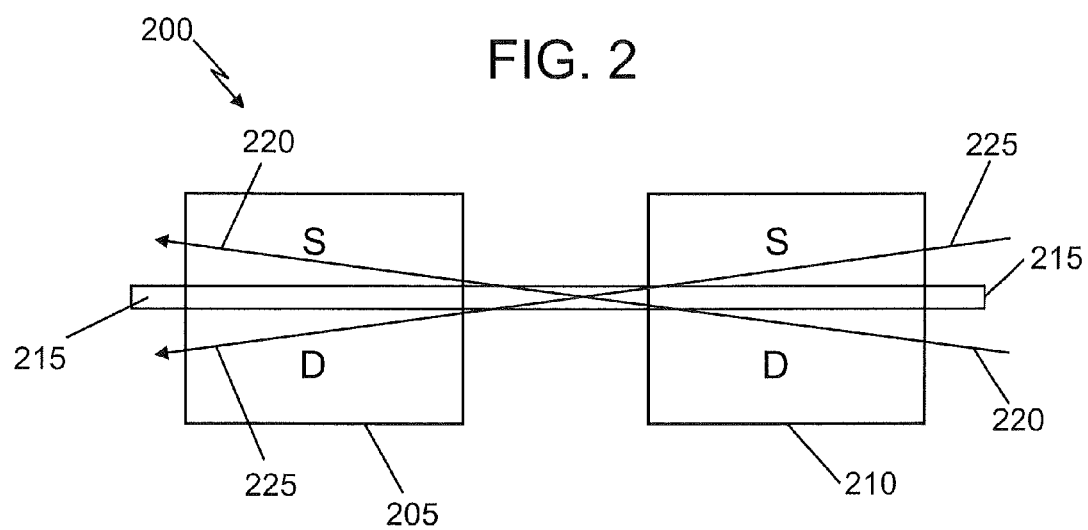
FIG. 2 illustrates two CMOS transistors in which the gate conductor for each transistor is arranged as a single, continuous "in-line" conductor for both transistors, according to an embodiment of the invention.

Referring to FIG. 2, there illustrated is an arrangement 200 of two CMOS transistors 205, 210, each transistor 205, 210 being located within its own RX (semiconductor—e.g., silicon) island using, e.g., SOI technology to form the transistors. The transistors 205, 210 may be nFETs (n-channel field-effect transistors) or pFETs (p-channel field-effect transistors) or a combination thereof. As a result of this arrangement 200, the gate conductors for both transistors 205, 210, are arranged in a straight line, according to an embodiment of the invention. It can be one continuous gate line as shown in FIG. 2, or two separate collinear gate lines, according to another embodiment of the invention. This type of transistor arrangement 200 is referred to as "in-line stacking" of the two transistors 205, 210. While this arrangement 200 is somewhat less effective than the "side-to-side" stacking transistor arrangement 100 of FIG. 1 in terms of IC area usage and interconnect wiring, the in-line stacking transistor arrangement 200 of FIG. 2 is relatively more effective in preventing an SEU to occur. This is because now the solid angle is relatively much smaller, for example, spanning approximately 25 degrees in the plane of the drawing, as indicated by the two lines with arrowheads 220, 225. Thus, analyzing the arrangement 200 from a geometric point of view, the transistor circuit arrangement 200 of FIG. 2 is nearly five times more effective in preventing an ionizing radiation particle from striking both of the transistors 205, 210 (i.e., five times less likely for a particle to hit both transistors 205, 210). However, depending on the geometry of the "side-by-side" circuit arrangement, anywhere from a three times to fourteen times improvement in preventing ionizing radiation particles from striking both of the transistors may be achieved.

Figure 3:
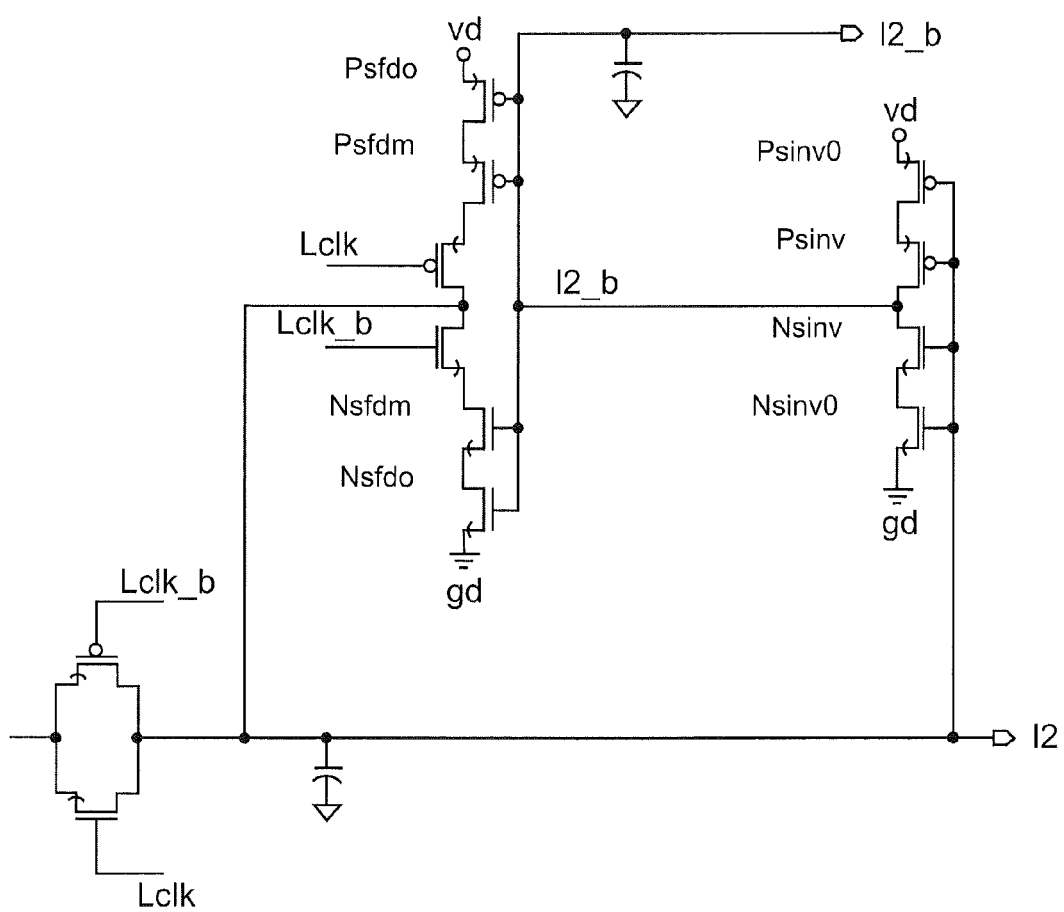
FIG. 3 is a schematic diagram of logic circuits having transistor circuits including both the prior art side-to-side transistor arrangement of FIG. 1 and the in-line transistor gate conductor arrangement of FIG. 2.

Referring to FIG. 3, there illustrated is a schematic diagram of transistor circuits including four pairs of redundant transistors forming a cross coupled inverter storage element. The transistors are labeled in a manner where the first four letters of a pair are identical, e.g., Psfdo and Psfdm. The pairs of redundant transistors can be laid out in a side-to-side arrangement 100 of FIG. 1 (prior art) or preferably in the in-line arrangement 200 of FIG. 2 according to an embodiment of the invention. A plurality of both types of arrangements may be implemented within the same IC or wafer using, e.g., SOI technology.

Embodiments of the invention find applicability in various types of logic circuits, such as latches and various types of gates, for example, NAND, NOR and other types of gates, as well as in various types of memory circuits (e.g., SRAM (static random-access memory), DRAM (dynamic random-access memory)), and also in sequential circuits. Also, no power increase is incurred with embodiments of the invention. However, embodiments of the present invention end up requiring somewhat more space on the IC wafer or chip to implement.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a cross coupled inverter storage element, comprising:
    forming four pairs of redundant transistors laid out in an in-line arrangement, a first pair of the four pairs of redundant transistors including a first transistor and a second transistor, the forming the first pair of transistors including:
        forming the first transistor in a first semiconductor island;
        forming the second transistor in a second semiconductor island,
        wherein the second semiconductor island is separate from the first semiconductor island,
        wherein the first and second semiconductor islands are arranged in an in-line stacking configuration that reduces a probability of an ionizing radiation particle striking the first transistor or the second transistor, and
        wherein the striking of the first transistor or the second transistor by the ionizing radiation particle causes a single event upset to occur; and
    providing each gate terminal conductor for each of the first transistor and the second transistor as a contiguous straight line,
        wherein the contiguous straight line provides a reduced solid angle spanning twenty five degrees for the ionizing radiation particle to travel between the first transistor and the second transistor, wherein the reduced solid angle spanning twenty five degrees prevents the single event upset from occurring.

2. The method of claim 1, wherein the first and second transistors comprise at least a portion of a sequential circuit.

3. The method of claim 1, wherein the first and second transistors comprise at least a portion of a memory circuit.

4. The method of claim 1, wherein the first and second transistors comprise at least a portion of a latch.

5. The method of claim 1, wherein the first and second transistors each comprise a CMOS transistor.

6. The method of claim 1, wherein the first and second semiconductor islands comprise silicon.

7. A method of forming a cross coupled inverter storage element, comprising:
   forming four pairs of redundant transistors laid out in an in-line arrangement, a first pair of the four pairs of redundant transistors including a first metal-oxide-semiconductor (CMOS) transistor and a second CMOS transistor, the forming the first pair of transistors including:
      forming the first CMOS transistor in a first silicon island;
      forming the second CMOS transistor in a second silicon island,
      wherein the second silicon island is separate from the first silicon island,
      wherein the first and second silicon islands are arranged in an in-line stacking configuration that reduces a probability of an ionizing radiation particle striking the first CMOS transistor or the second CMOS transistor,
   wherein the striking of the first CMOS transistor and the second CMOS transistor by the ionizing radiation particle causes a single event upset to occur; and
   providing each gate terminal conductor for each of the first CMOS transistor and the second CMOS transistor a contiguous straight line,
   wherein the contiguous straight line provides a reduced solid angle spanning twenty five degrees for the ionizing radiation particle to travel between the first CMOS transistor and the second CMOS transistor,
   wherein the reduced solid angle spanning twenty five degrees prevents the single event upset from occurring.

8. The method of claim 7, wherein the first and second CMOS transistors comprise at least a portion of a sequential circuit.

9. The method of claim 7, wherein the first and second CMOS transistors comprise at least a portion of a memory circuit.

10. The method of claim 7, wherein the first and second CMOS transistors comprise at least a portion of a latch.

11. The method of claim 1, wherein each pair of four pairs of redundant transistors includes first and second transistors formed in accordance with the forming the first pair of transistors.

\* \* \* \* \*

UNITED STATES PATENT AND TRADEMARK OFFICE
CERTIFICATE OF CORRECTION

PATENT NO. : 9,165,917 B2  
APPLICATION NO. : 12/473409  
DATED : October 20, 2015  
INVENTOR(S) : Ethan H. Cannon et al.

Page 1 of 1

It is certified that error appears in the above-identified patent and that said Letters Patent is hereby corrected as shown below:

Claims  
Claim 7, Column 6, Line 9, before "a" insert --as--.

Signed and Sealed this  
Fifth Day of April, 2016

Michelle K. Lee  
*Director of the United States Patent and Trademark Office*